United States Patent [19]

Milewski

[11] Patent Number: 5,404,836
[45] Date of Patent: Apr. 11, 1995

[54] METHOD AND APPARATUS FOR CONTINUOUS CONTROLLED PRODUCTION OF SINGLE CRYSTAL WHISKERS

[76] Inventor: John V. Milewski, 2881 Tramway Pl., NE., Albuquerque, N. Mex. 87122

[21] Appl. No.: 434,986
[22] Filed: Nov. 9, 1989

Related U.S. Application Data

[63] Continuation-in-part of Ser. No. 305,762, Feb. 3, 1989, abandoned.

[51] Int. Cl.$^6$ .................. C30B 29/36; C30B 29/38; C30B 29/62; C30B 35/00
[52] U.S. Cl. ........................... 117/87; 117/91; 117/98; 117/205; 117/921; 117/952; 423/290; 423/291; 423/344; 423/346; 501/87; 501/95; 501/96; 501/97
[58] Field of Search ............ 501/87, 88, 92, 95, 501/96, 97; 423/291, 346, 345, 384, 460, 290; 156/DIG. 64, DIG. 88, DIG. 99, 609, DIG. 86, DIG. 112; 117/87, 91, 98, 205, 921, 952

[56] References Cited

U.S. PATENT DOCUMENTS

| | | | |
|---|---|---|---|
| 2,122,982 | 7/1938 | Leo | 99/132 |
| 3,580,731 | 5/1971 | Milewski | 117/66 |
| 3,622,272 | 11/1971 | Shyne et al. | 423/346 |
| 3,632,405 | 1/1972 | Kippenberg | 23/300 |
| 3,692,478 | 9/1972 | Kippenberg et al. | 423/346 |
| 3,721,732 | 3/1973 | Knippenberg et al. | 423/346 |
| 3,808,087 | 4/1974 | Milewski et al. | 161/72 |
| 3,855,395 | 10/1974 | Cutler | 423/344 |
| 4,013,503 | 3/1977 | Kippenberg et al. | 423/439 |
| 4,155,781 | 5/1979 | Diepers | 156/609 |
| 4,500,504 | 2/1985 | Yamamoto | 423/345 |
| 4,504,453 | 3/1985 | Tanaka et al. | 423/345 |
| 4,702,901 | 10/1987 | Shalek | 423/345 |
| 4,789,536 | 12/1988 | Schramm et al. | 423/345 |
| 4,789,537 | 12/1988 | Shalek et al. | 423/345 |
| 4,911,781 | 3/1970 | Fox et al. | 423/346 |
| 4,915,924 | 4/1990 | Nadkarni et al. | 423/345 |
| 5,116,679 | 5/1992 | Nadarni et al. | 423/291 |

FOREIGN PATENT DOCUMENTS

| | | | |
|---|---|---|---|
| 62-91499 | 4/1987 | Japan | 423/346 |
| 63-291900 | 11/1988 | Japan | 423/346 |
| 1-197400 | 8/1989 | Japan | 423/346 |

*Primary Examiner*—Gary P. Straub
*Attorney, Agent, or Firm*—William A. Eklund

[57] ABSTRACT

Described herein is a method and apparatus for continuously growing single crystal whiskers of silicon carbide, silicon nitride, boron carbide and boron nitride by the VLS process under controlled reaction conditions. A growth substrate such as a plate of solid graphite is coated with a suitable VLS catalyst and is conveyed through a tubular furnace, into which is separately introduced two feed gases. The first feed gas contains a cationic suboxide precursor such as silicon monoxide or boron monoxide. The second feed gas contains an anionic precursor compound such as methane or ammonia. The precursor compounds react upon exposure to the catalyst by the VLS process to produce crystalline whiskers. The associated apparatus includes a conveyor assembly that continuously circulates multiple substrate growth plates through the furnace and past a harvesting device which brushes the whiskers from the plates and removes them by vacuum collection. Whiskers of uniform size, shape, and purity are produced.

3 Claims, 4 Drawing Sheets

METHOD AND APPARATUS FOR CONTINUOUS CONTROLLED PRODUCTION OF SINGLE CRYSTAL WHISKERS

CROSS REFERENCE TO RELATED APPLICATION

This application is a continuation-in-part of application Ser. No. 07/305,762, filed Feb. 3, 1989, now abandoned and entitled "Continuous Growth Process For Production Of Single Crystal Fibers (Whiskers)," which is hereby incorporated by reference.

BACKGROUND OF THE INVENTION

1. Field of the Invention

The invention described and claimed herein is generally related to the production of single crystal fibers known as whiskers. More particularly, the present invention is related to apparatus and methods for continuously making whiskers by the vapor-liquid-solid (VLS) method.

2. Description Of Related Art Including Information Disclosed Under 37 C.F.R. 1.97–1.99

Crystalline fibers of materials such as silicon carbide, silicon nitride, boron carbide and boron nitride are commonly referred to as whiskers. In bulk form these materials are known for their hardness. In whisker form, they are further noted for their high tensile strength and high modulus relative to other fibrous materials, as well as their high chemical stability and high resistance to corrosion and oxidation. All of these characteristics are retained even at relatively high temperatures, making whiskers of these materials desirable as reinforcing elements in ceramics, metals, polymeric composite materials, and in other applications. Further, yarns and other woven materials made from these whiskers would have widespread utility, but there has not been heretofore available a process for making significant quantities of high quality whiskers that are also sufficiently long to be spun into yarn.

It has been previously known to prepare silicon carbide and silicon nitride whiskers by processes such as those described in U.S. Pat. Nos. 2,122,982 and 3,855,395. These processes suffer from the disadvantage that they produce a significant amount of non-fiber particulate material as well as particular impurities, which must be separated from the whisker product before it can be used.

Also, the above-referenced previously known processes produce whiskers of varying thicknesses as well as varying lengths. In this regard, it is known that whiskers having thicknesses of less than about a micron constitute a health hazard similar to that of asbestos, and a three micron thickness has been considered a minimum diameter for safe handling in the absence of special precautions. The whisker product of these prior art processes contains a significant amount of sub-micron sized whiskers, and for this reason must be considered hazardous.

Whiskers are also known to be produced by the Tokai process, disclosed in U.S. Pat. No. 4,500,504 to Yamamoto, which involves exchanging a water soluble catalyst onto a silica gel, mixing the dried silica gel with a fine particle carbon black, and reacting the mixture in a nonoxidative atmosphere at elevated temperature. This process produces a sub-micron diameter whisker.

U.S. Pat. No. 4,504,453 to Tanaka, et al., discloses the use of thin, porous silicon-and carbon-containing material, which is passed through a series of increasing temperature zones to produce sub-micron silicon carbide whiskers in the material.

The vapor-liquid-solid (VLS) process for growing whiskers is described, for example, in U.S. Pat. No. 3,622,272 to Shyne, et al., U.S. Pat. No. 3,692,478 to Knippenberg, et al., U.S. Pat. No. 3,721,732 to Knippenberg, et al., and U.S. Pat. No. 4,013,503 to Knippenberg, et al. In the VLS process gaseous compounds of whisker constituents such as silicon and carbon are introduced into a reaction chamber at an elevated temperature. There is also introduced into the reaction chamber a solid substrate that is coated with a particulate catalyst, which melts at the temperature of the chamber to form small molten beads. The gaseous reactants dissolve in the molten catalyst beads. Suitable catalysts for carbide type whiskers for this purpose include iron, manganese, nickel, cobalt, ferro silicon, stainless steel and various glasses for nitride type whiskers.

Solid silicon carbide crystallizes out of the molten catalyst at the interface between the molten catalyst and the underlying solid substrate. The silicon carbide typically crystallizes in the form of a slender whisker of solid crystalline beta silicon carbide, with the molten catalyst bead resting on and being raised upwardly on the end of the whisker as the whisker grows. The whisker is typically of a diameter similar to that of the molten catalyst bead.

Other carbide and nitride whiskers, for example $B_4C$, $TiC$, $S_3N_4$ and $BN$ can also be grown by the VLS process, using various transition metals, iron alloys and glasses as catalysts.

U.S. Pat. No. 4,789,537 to Shalek, et al., discloses an improvement to the VLS process, whereby a catalyst is prealloyed with silicon and carbon to accelerate the initiation of the VLS process for growing silicon carbide whiskers. A disadvantage however of using prealloyed catalysts is that prealloying lowers the melt viscosity of the catalyst, thereby causing excessive wetting and spreading of the molten catalyst, which breaks into small parts. This in turn produces a large number of submicron diameter whiskers, which as noted above are recognized to be a health hazard.

It has been previously known to grow submicron diameter silicon carbide whiskers on carbon yarn that is pulled through a tubular furnace, as disclosed in U.S. Pat. No. 3,580,731. Although the process disclosed therein allows for continuous whisker production in small quantities, it does not utilize the advantages of the VLS process, and there is also no means for controlling the stoichiometry of the reactant gases in the furnace, so that there is no means for controlling the crystal sizes or morphologies obtained by the process.

SUMMARY OF THE INVENTION

Accordingly, it is the object and purpose of the present invention to provide an improved method and a related apparatus for growing single crystal whiskers of silicon carbide, silicon nitride, boron carbide and boron nitride.

It is also an object and purpose of the present invention to provide a method and apparatus for producing such whiskers on a continuous basis.

It is another object and purpose of the present invention to provide a method and apparatus for continuously producing single crystal whiskers characterized by high purity, low particulate levels, and high aspect ratios.

Still another object of the invention is to provide a method and apparatus for producing whiskers which are uniformly more than about 3 microns in diameter and which therefore pose a less health hazard than whiskers products having varying whisker diameters, including submicron diameters which are recognized to be hazardous.

It is another object of the present invention to provide a method and apparatus for continuously producing whiskers by the VLS process, wherein the stoichiometry of the reactant gas mixture and the concentration of the whisker constituents in the molten VLS catalyst can be continuously controlled to obtain optimum whisker sizes and morphologies.

With regard to the present invention, it if noted that the compounds SiC, $Si_3N_4$, $B_4C$ and BN may all be characterized as consisting of a cationic element (silicon or boron) and an anionic element (carbon or nitrogen). Consequently, in this specification the term cationic precursor feed gas is used to refer to gases that are useful in the VLS process and which contain silicon or boron and the term anionic precursor feed gas is used to refer to gases which are useful in the VLS process and which contain carbon or nitrogen.

The present invention provides a method for continuously growing whiskers of silicon carbide, silicon nitride, boron carbide or boron nitride. In accordance with the method, a suitable growth substrate is first coated with a solid particulate catalyst, and is subsequently conveyed through a furnace maintained at an elevated temperature sufficiently high to melt the catalyst. There are separately introduced into the heated furnace cationic and anionic precursor feed gases which contain gaseous precursor compounds containing the elemental components of the whiskers to be crystallized by the VLS process. The relative rates of introduction of the precursor compounds may be varied so to enable the stoichiometry of the gaseous reactants in the furnace, as well as the degree of supersaturation of the gases in the VLS catalyst, to be varied as may be necessary to obtain optimum crystalline morphologies, sizes or other whisker characteristics.

In the preparation of either silicon carbide or silicon nitride whiskers by the method of the invention, silicon is preferably introduced into the furnace in the form of gaseous silicon monoxide. The silicon monoxide is preferably produced by a silicon monoxide generator located within the furnace. The generator includes a porous refractory brick material that is impregnated with powdered silica and carbon. The silica and carbon react to form silicon monoxide. The rate of generation of silicon monoxide and the rate of its introduction into the furnace are preferably controlled by passing a moderating gas through the porous generator brick. The moderating gas consists essentially of a reducing carrier such as hydrogen, and a variable concentration of carbon monoxide. Carbon monoxide suppresses the generation of silicon monoxide, and is thus used to moderate the introduction of silicon monoxide into the furnace.

The anionic precursors carbon and nitrogen are introduced into the furnace in form of a light hydrocarbon and ammonia, respectively. These compounds are introduced in a reducing carrier gas that preferably includes an inert diluent, for example nitrogen. In the preferred embodiment, carbon is introduced as methane in a carrier of hydrogen and nitrogen. Nitrogen is preferably introduced as ammonia in a carrier of hydrogen and nitrogen. Ammonia thermally decomposes to hydrogen and nacent-nitrogen, which an active specie of nitrogen.

Boron is introduced as a cationic precursor in the form of gaseous boron monoxide. The boron monoxide is generated within the furnace by a solid-state disproportionation reaction of solid boron and solid boric oxide, which can be combined for example in a pelletized bed. The rate of generation of boron monoxide and its introduction into the furnace may be preferably controlled by passing a moderating carrier gas through the boron monoxide generator, the moderating gas preferably consisting of an inert diluent such as nitrogen, in a carrier of hydrogen.

In the furnace, the gaseous cationic and anionic precursors react in the molten catalyst beads to form crystalline whiskers by the VLS process. For example, silicon monoxide and methane react in a molten metal catalyst to form crystalline beta silicon carbide in the VLS process, and to release water vapor and hydrogen waste byproducts. Likewise, silicon monoxide and ammonia are introduced to form silicon nitride whiskers; boron monoxide and methane may be introduced to form boron carbide whiskers; and boron monoxide and ammonia may be introduced to form boron nitride whiskers.

The present invention also is directed to an apparatus particularly adapted for conducting the process of the invention, in that it continuously produces crystalline whiskers of uniform size and quality. The apparatus comprises a furnace and a conveyor means supporting associated growth substrate means. The conveyor means is operable to convey the growth substrate through the furnace, preferably in a continuous loop. The apparatus further comprises means for applying a VLS catalyst on the growth substrate means as the growth substrate means is conveyed into the furnace by the conveyor means, and collection means for collecting whiskers grown on the growth substrate means upon exit of the growth substrate means from the furnace. The apparatus further includes means for separately introducing cationic and antonic precursor feed gases into the furnace in contact with the substrate growth means.

In the preferred embodiment the conveyor means includes a conveyor system that carries a plurality of growth substrate plates in a continuous loop through the furnace, which is preferably tubular in structure. The growth substrate plates are preferably composed of graphite, alumina, or other refractory materials, with the choice of a particular substrate material depending on the type of whiskers to be grown.

The means for applying the VLS catalyst preferably includes a particulate dispersal means for uniformly dispersing a powdered particulate catalyst material onto the growth substrate plates as they enter the furnace.

The collection means preferably includes a brushing apparatus for brushing the whiskers from the growth substrate plates as they exit from the furnace, and a vacuum collection system for transporting the whiskers to a collection container.

These and other aspects of the present invention will be more apparent upon consideration of the following detailed description of the invention, when taken with the accompanying drawings.

BRIEF DESCRIPTION OF THE DRAWINGS

The Figures set forth in the accompanying drawings from a part of this specification and are hereby incorporated by reference. In the Figures.

DESCRIPTION OF THE PREFERRED EMBODIMENT

Figure 1:
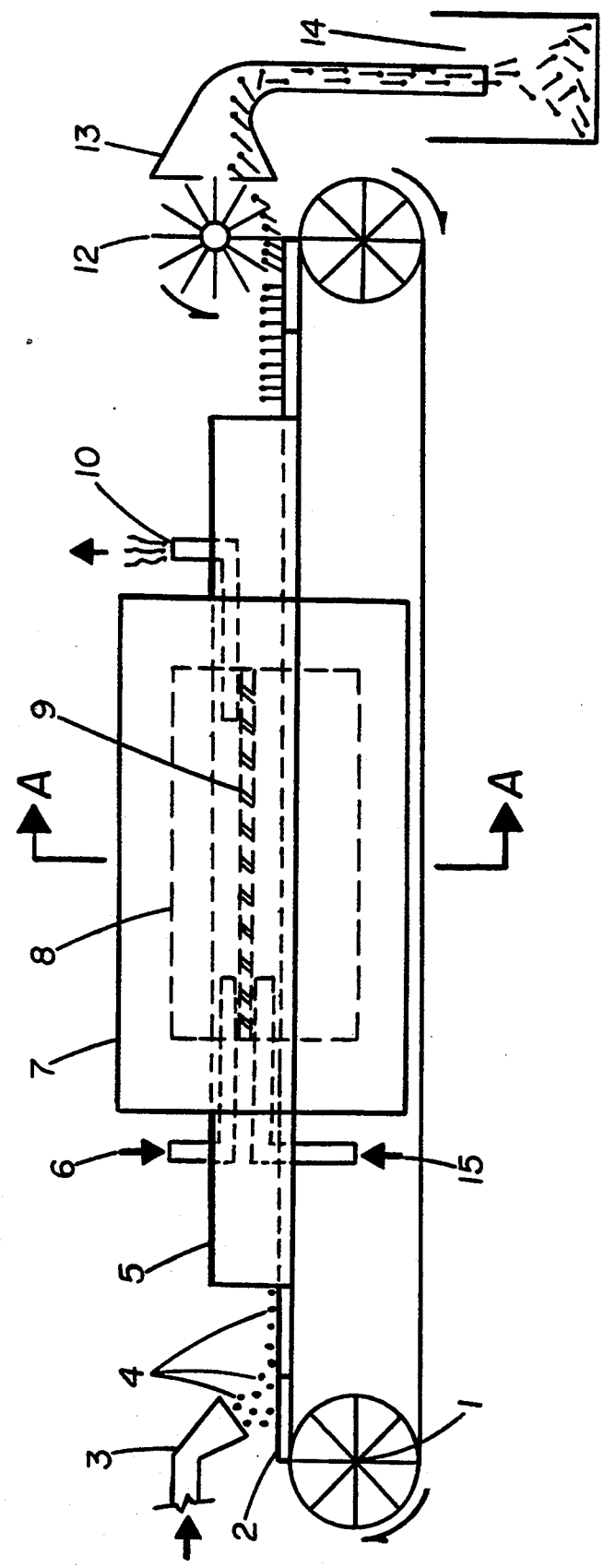
FIG. 1 is a plan view of the whisker growth apparatus of the present invention.
Figure 2:
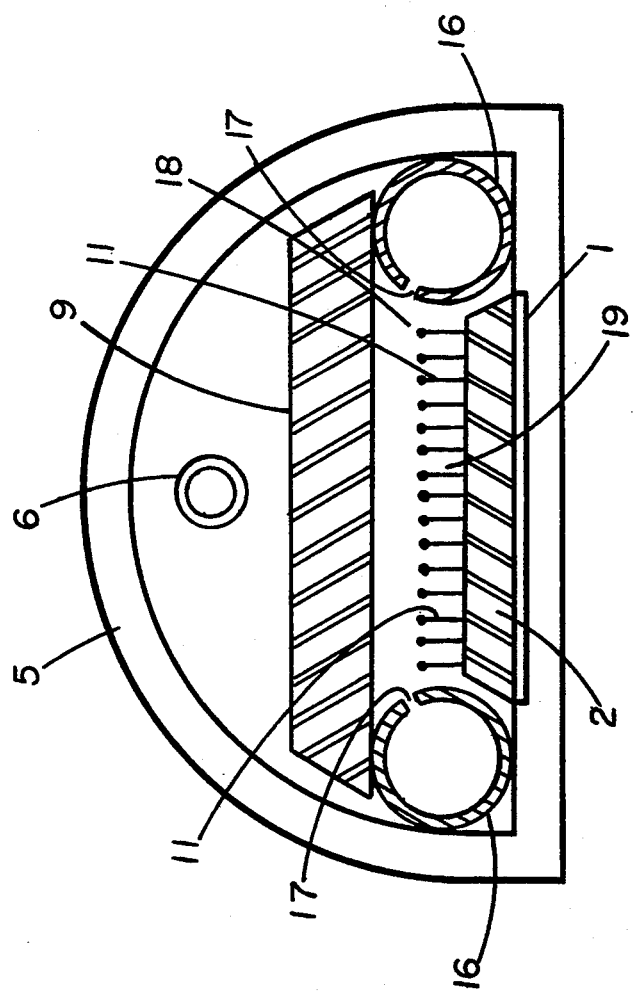
FIG. 2 is a cross sectional view of the furnace tube of the apparatus of FIG. 1, taken as section A—A.

Referring to FIGS. 1 and 2, the apparatus of the present invention includes a conveyor belt system 1 which carries a number of growth substrate plates 2 in a continuous loop. The conveyor system may be a conveyor belt, chain or other suitable arrangement. The catalyst spray coater 3 coats the growth substrate plates 2 with catalyst particles 4.

The conveyor belt system 1 carries the growth substrate plates 2, coated with catalyst particles 4, into a furnace tube 5. The furnace 5 includes a gas inlet tube 6 for introduction of a moderating gas, for example carbon monoxide and carrier gas. The furnace tube 5 extends through a high temperature furnace 7, which includes a central hot zone 8.

In the hot zone 8 of the furnace 7 is located a cationic precursor suboxide gas generator 9, which generates a suboxide feed gas as more particularly described below. Spent gases are discharged through a spent gas discharge tube 10. Monocrystalline whiskers 11 grow on the upper surface of the growth substrate plates 2 as they are conveyed through the furnace. Upon existing from the furnace 7 the whiskers 11 are brushed from the plates 2 by a rotating brush 12, harvested by a vacuum collection system 13, and collected in container 14.

An anionic precursor feed gas is introduced through a feed tube 15 and dispersed throughout the furnace by a distribution manifold 16 having gas mixing jets 17.

Referring particularly to FIG. 2, the feed gases are mixed in a mixing chamber 18 which is below the suboxide gas generator 9 and above the plates 2.

Figure 3:
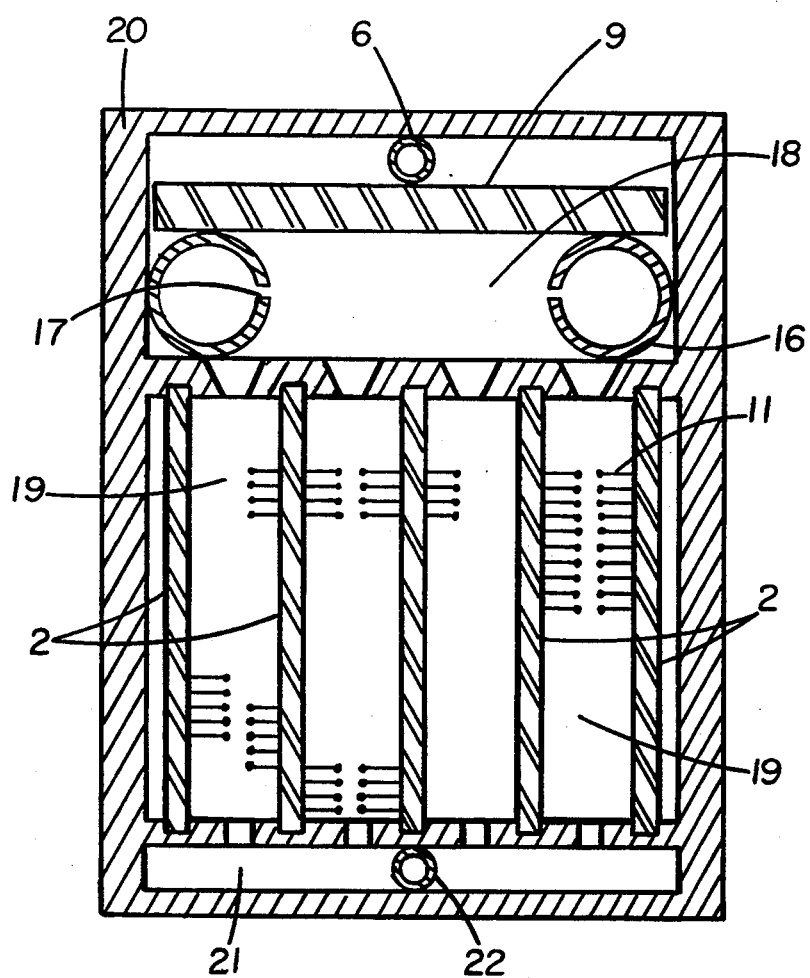
FIG. 3 is a cross sectional view of an alternative embodiment having multiple vertically oriented substrate growth plates.

FIG. 3 illustrates an alternative embodiment in which there are multiple plates 2 which are vertically oriented. The plates 2 are pushed through the furnace, sliding in upper and lower slots which are provided for guiding the plates 2. In this regard, the plates 2 in some cases can be made of graphite, as can the supporting slots, giving a low-friction sliding structure even at high temperatures. Above the plates 2 is provided a gas mixing chamber 18, in which the precursor feed gases are mixed. The anionic precursor gases, preferably containing carbon or nitrogen in the form of methane or ammonia in suitable carriers, are introduced through manifolds 16 and into the reaction chamber through associated mixing jets 17. The porous cationic precursor suboxide generator 9 is suspended above the mixing changer 18. Above the suboxide generator 9 is a gas inlet tube 6 through which a moderating gas is introduced and caused to flow downwardly through the porous suboxide generator 9. Between the vertical plates 2 are whisker growth areas in which the mixed precursor gases are exposed to the molten catalyst beads on the plates 2. The whiskers 11 grow outwardly from the plates 2 and are harvested upon exit from the furnace by brushing and vacuum collection, as described above with respect to the embodiment shown in FIGS. 1 and 2, or by other suitable means.

Still referring to FIG. 3, between the furnace walls 20 and at the bottom of the furnace is a spent gas collection manifold 21, in which there is a spent gas outlet tube 22.

The anionic precursor feed gas introduced through tube 15 contains carbon in the form of a hydrocarbon gas, preferably methane, which is preferably contained in a reducing carrier consisting essentially of hydrogen and nitrogen. The carrier preferably consists primarily of hydrogen, containing nitrogen in a concentration of between about 4% and 12%, and most preferably about 7%, by volume; and also containing methane in a concentration of between about 1% and 3% by volume, and most preferably about 2%.

In the production of silicon carbide whiskers, silicon is supplied to the reaction in the form of silicon monoxide, which is generated by a solid stated reaction between silica ($SiO_2$) and carbon, which may be in the form of carbon black. Generation of silicon monoxide is moderated and controlled by passing a gaseous mixture of carbon monoxide and hydrogen through a porous refractory brick impregnated with a mixture of powdered carbon and silica. Carbon monoxide inhibits the generation of silicon monoxide in this system, and hence by controlling the amount of carbon monoxide in the hydrogen stream the rate of generation of silicon monoxide can be controlled. In practice, the carbon monoxide concentration in the hydrogen stream is preferably between about 5% and 20% by volume, with a range of 7% to 8% by volume being most preferred.

The silicon monoxide generator preferably includes a porous, refractory, aluminosilicate brick impregnated with a mixture of finely powdered silica and carbon. A suitable brick material is sold by Babcock and Wilcox Co. and is identified as K-30 brick. Within the impregnated brick, silicon monoxide gas is formed by the reaction:

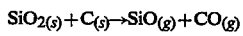

$$SiO_{2(s)} + C_{(s)} \rightarrow SiO_{(g)} + CO_{(g)}$$

It will be understood from the above reaction that excess carbon monoxide will suppress the generation of silicon monoxide. This is the basis for the use of externally supplied carbon monoxide to moderate the production of silicon monoxide. This is desireable for two reasons. First, the solid state silicon monoxide generator typically does not generate silicon monoxide at a constant rate. The generation rate for a freshly composed SiO generator typically rises quickly to a maximum rate and then progressively decreases as the solid reactants are gradually depleted. Consequently it is desireable to moderate the generation of silicon monoxide bypassing externally supplied carbon monoxide through the generator. The carbon monoxide content of the moderating gas is gradually decreased, to counter the decreasing generation of SiO mentioned above, to thereby obtain a relatively constant supply of silicon monoxide being introduced into the furnace reaction chamber. In practice the composition of the gaseous reaction mixture in the furnace chamber may be monitored, for example by spectroscopic techniques, to determine the optimum use of the moderating gas.

The catalyst particles melt to molten beads upon entering the furnace. The feed gases, for example methane and silicon monoxide, dissolve in the molten metal catalyst. Under the effect of the molten catalyst the feed gases react by the reaction:

$$SiO + CH_4 \rightarrow SiC_s + H_2 + H_2O$$

It is believed that the methane and silicon monoxide actually decompose to elemental silicon and carbon at the interface between the furnace atmosphere and the molten catalyst, and that it is primarily elemental silicon and carbon which dissolve in the catalyst and subsequently react with one another to crystallize as silicon carbide.

The solid silicon carbide crystallizes out of the molten catalyst in the form of a slender whisker of crystalline silicon carbide. The molten catalyst bead is elevated on the end of the whisker as the whisker continuously crystallizes and grows longer. Growth continues as the feed gases dissolve in the molten catalyst bead and crystallize therefrom at the solid-liquid interface between the bead and the underlying whisker. The length of the whisker is determined by the length of time the catalyst is exposed to the feed gases. The diameter of the whisker is determined largely by the size of the molten bead. By selecting the size of the solid particles which melt to become the catalyst beads, the diameters of the resulting whiskers can be selected. Thus, with this process the aspect ratio, which is the ratio of the length to the diameter of the whiskers, can also be controlled. This is significant in micropacking for fabrication of efficiently reinforced short-fiber composites.

Figure 4:
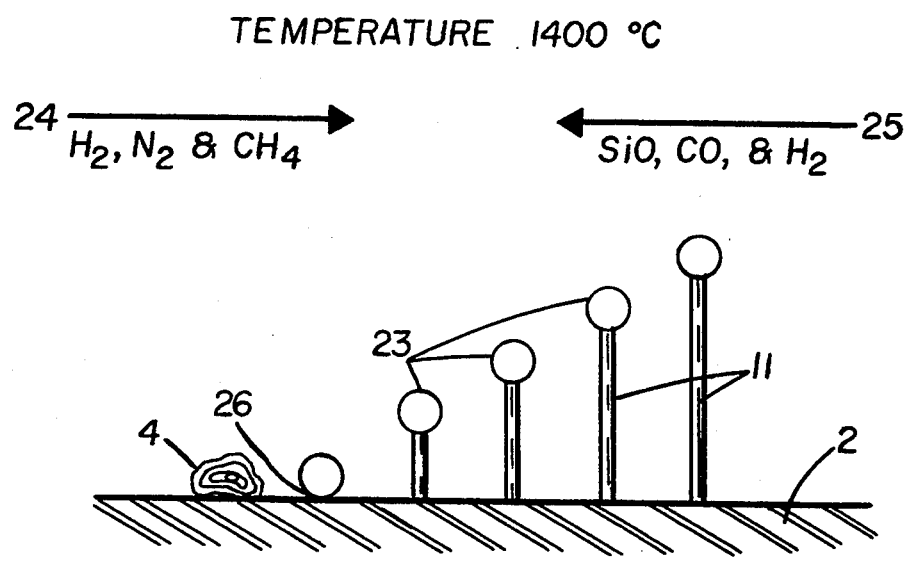
FIG. 4 is an illustration of the VLS whisker growth process.

A sequence for the growth of beta silicon carbide (SiC) whiskers by the VLS process is shown in FIG. 4. Referring to FIG. 4, solid particles 4 of a suitable metal catalyst, for example #304 stainless steel, are melted at about 1,400° C. to form spherical liquid catalyst beads 23. Gaseous feed vapors are introduced into the furnace and supersaturate the molten beads 23. Silicon carbide crystallized out of the molten bead 23 at the liquid-solid interface 26 between the bead 23 and the growth substrate plate 2. As whiskers 11 form and grow, the beads 23 are raised upwardly on the ends of the whiskers 11, and continue to absorb feed gases from the surrounding furnace atmosphere to continue the growth process.

In the production of silicon nitride ($Si_3N_4$) whiskers, silicon monoxide is generated, moderated with carbon monoxide, and introduced into the furnace as described above. Nitrogen is introduced into the furnace in a second feed gas, or an anionic precursor feed gas, in the form of ammonia ($NH_3$). The ammonia is carried in a carrier of hydrogen and an inert diluent such as nitrogen. This feed gas preferably includes between 30% and 65% by volume hydrogen, 30% to 55% by volume ammonia, and 2% to 15% by volume nitrogen. Optimum composition of the anionic precursor feed gas is approximately 55% hydrogen, approximately 40% ammonia, and approximately 5% nitrogen.

In the production of boron carbide ($B_4C$) whiskers, carbon is introduced into the furnace as described above with respect to the production of silicon carbide. That is, it is introduced in the form of a light hydrocarbon, preferably methane, in a reducing carrier preferably consisting of hydrogen and an inert diluent such as nitrogen. The carrier preferably consists primarily of hydrogen, containing nitrogen in a concentration of between about 4% and 12% and most preferably about 7% by volume; and also containing methane in a concentration of between about 1% and 3% by volume, and most preferably about 2%

Boron is introduced into the furnace in the form of gaseous boron monoxide (BO), which is produced by a solid-state disproportionation reaction between boron and boric oxide ($B_2O_3$), according to the following reaction:

$$B_s + B_2O_{3(s)} \rightarrow 3BO_{(g)}$$

This disproportionation reaction may be carried out in a suitable porous material, for example alumina, when impregnated with powdered boron and boric oxide. Alternatively, this reaction may be conducted in a pelletized bed of solid boron and boric oxide. In either case, the rate of generation of BO and the rate of its introduction into the furnace are regulated by passing a stream of an inert diluent gas, such argon or preferably nitrogen in a carrier of hydrogen, through the impregnated alumina or the pelletized bed. The boron monoxide and methane react under the influence of the metallic catalyst to form crystalline boron carbide according to the following reaction:

$$4BO_{(g)} + CH_{4(g)} + 2H_{2(g)} \rightarrow B_4C_{(s)} + 4H_2O_{(g)}$$

As noted above, It is believed that this overall reaction occurs partly at the surface of the molten catalyst, with boron and carbon dissolving in the catalyst in elemental form and reacting therein to form boron carbide whiskers. Metal catalysts are operable for the formation of boron carbide.

In the production of boron nitride (BN) whiskers, boron is introduced as boron monoxide and is produced by the disproportionation reaction discussed above, and nitrogen is introduced in the form of ammonia, also as described above. Production of boron monoxide is controlled with an inert diluent such as nitrogen in a carrier of hydrogen, which is passed through the boron monoxide generator. The anionic precursor feed gas consists of ammonia, carried in a carrier such as hydrogen and an inert diluent such as nitrogen. The anionic precursor feed gas preferably contains between 30% and 65% by weight hydrogen; between 30% and 55% by volume ammonia, and between 2% and 15% by volume nitrogen. An optimum composition of the feed gas is approximately 55% by volume hydrogen, 40% ammonia, and 5% nitrogen. A glass catalyst is preferred, with a borate glass being most preferred.

It will be noted from the discussion above that glass catalysts are preferred for generation of the nitride whiskers, and metal catalysts are preferred for generation of the carbide whiskers.

In all of the above reactions, the use of an inert diluent such as nitrogen is useful for preventing the development of excess supersaturation of the reactive gases in the catalyst, thereby keeping the crystallization reaction from proceeding too fast, which can otherwise result in poor whisker quality. The amount of the nitrogen or other diluent, such as argon, can be varied to achieve optimum crystal growth.

It will recognized that in the production of all of the whiskers described above, the stoichiometry of the gaseous mixture of precursor compounds in the reaction chamber can be varied in several ways. First, the rate of generation of the suboxide precursor, i.e. either silicon monoxide or boron monoxide, can be varied by varying the absolute rate of flow of the moderating gas through the suboxide generator. Secondly, in the case of the silicon monoxide generator the rate of generation of silicon monoxide may also be moderated by varying the amount of carbon monoxide in the moderating gas. Further, the rates of introduction of the anionic precursor compounds (methane or ammonia) can be varied by either varying the absolute flow rate of the feed gas, or by varying the concentration of the anionic precursor in the feed gas. Finally, the amount of inert diluent in the feed gas can be varied to either dilute or concentrate the concentration of the anionic precursor compound in the reaction chamber. This combination of variables enables very precise yet extensive control over the composition and reaction conditions of the gaseous mixture exposed to the VLS catalyst, and thereby allows for optimum whisker growth conditions to be achieved.

The following examples explain how the present invention may be practiced to produce the whiskers described above.

EXAMPLE 1

Silicon Carbide Whiskers

Beta silicon carbide whiskers may be grown on a growth substrate consisting of a number of graphite plates which are passed sequentially through a tubular muffle furnace. A suitable catalyst for the VLS reaction is nominal $15\mu$ diameter spherical 304 stainless steel powder. The catalyst is dispersed evenly onto each graphite plate at a concentration of about 0.5 grams per square foot. A suitable tubular furnace is of a cross section of about 50 square inches and is maintained at a temperature of 1,400° C. A silicon monoxide generator, consisting of a porous brick impregnated with fine-grained silica and carbon powder, is suspended in the furnace above the path of the graphite plates. A moderating gas is caused to flow through the silicon monoxide generator at a rate which may be varied to effect optimum concentration of silicon monoxide in the furnace. The moderating gas may consist of hydrogen with carbon monoxide at a concentration of about 8% by volume. The gas supplied as the cationic precursor feed gas may consist of hydrogen with about 7% to 8% nitrogen and about 2% by volume methane. The nominal flow rate of each gas may be approximately 5 liters per minute per foot of hot zone within the furnace. Beta silicon carbide whiskers $4\mu$ to $6\mu$ in diameter can be produced by this method, having aspect ratios of 300 to 10,000. The whiskers may be harvested from the graphite plates upon exit from the furnace by brushing and vacuum collection as described above.

EXAMPLE 2

Silicon Nitride Whiskers

Alpha silicon nitride whiskers may be grown on a growth substrate consisting of a number of alumina plates. A catalyst consisting of nominal $5\mu$ diameter glass beads may be used. The glass is preferably a soda-lime silicate glass. The catalyst is dispersed on the alumina plates at a concentration of about 0.5 grams per square foot. A tubular muffle furnace having a cross section of 50 square inches and maintained at a temperature of 1,440° C. is suitable.

Silicon is introduced into the furnace as silicon monoxide, which is generated with a silicon monoxide generator as described above, consisting of a porous silicate brick impregnated with silica and carbon. The rate of introduction of silicon monoxide into the furnace is moderated by a stream of hydrogen and carbon monoxide passed through the generator.

Nitrogen is introduced into the furnace in the form of ammonia in a carrier consisting of hydrogen and nitrogen.

EXAMPLE 3

Boron Carbide Whiskers

In this example, boron carbide whiskers may be produced using the apparatus and method of the invention. A growth substrate may consist of a number of graphite plates. A catalyst consisting of nominal $15\mu$ spherical nickel powder is dispersed on the graphite growth plates at a concentration of about 0.5 grams per square foot. A tubular muffle furnace having a cross section of 50 square inches, maintained at a temperature of 1,500° C., is suitable.

A boron monoxide generator consists of a pelletized bed of boron and boric oxide. A moderating gas consists of an inert diluent such as nitrogen in a carrier of hydrogen. A total flow of the moderating gas is approximately 5 liters per minute per foot of hot zone, although flow rates of between 2 liters and 15 liters per minutes may be used, depending on the crystal morphology desired. Carbon is supplied in an anionic precursor feed gas, supplied to the distribution manifold 16. This feed gas may consist of hydrogen with nitrogen at a concentration of about 7% and methane at a concentration of about 2%. The total flow of these gases is about 5 liters per minute per foot of hot zone.

Whisker growth is initiated in about twenty minutes. The growth rate varies from about $0.5\mu$ to $2.0\mu$ per second, with $1.0\mu$ per second being average. Using the $15\mu$ nickel catalyst, boron carbide whiskers $4\mu$ to $6\mu$ in diameter are produced. Whiskers having an aspect ratio (length to diameter) of from 300 to 10,000 are produced depending on the time in the furnace.

EXAMPLE 4

Boron Nitride Whiskers

In this example, boron is generated in a boron/boric oxide generator as described above, and is introduced into the furnace in a stream of moderating gas consisting of an inert diluent such as nitrogen in a carrier of hydrogen. Nitrogen is introduced into the furnace as ammonia in a carrier of hydrogen and nitrogen. A suitable catalyst is a borate glass. A $10\mu$ diameter catalyst will produce about a $5\mu$ diameter whisker of cubic boron nitride.

The anionic precursor feed gas consists of ammonia in a carrier consisting of a mixture of hydrogen and an inert diluent such as nitrogen. The anionic precursor feed gas preferably contains between 30% and 65% by weight hydrogen, between 30% and 55% by volume ammonia, and between 2% and 15% by volume nitrogen. An optimum composition of the feed gas is approximately 55% by volume hydrogen, 40% ammonia, and 5% nitrogen.

Utility

The present invention is useful for continuously producing relatively large quantities of whiskers of high quality and uniform shape and size. Precise stoichiometric adjustments in the feed gases, resulting in desired whisker characteristics, can be made by selectively adjusting the compositions of the anionic and cationic precursor feed gases.

Whiskers of the type produced by this invention are characterized by high tensile strength, which strength is maintained at high temperatures. Consequently whiskers are of particular utility in the formation of fiber reinforced composite materials, including fiber reinforced ceramics, polymers and metals.

Whiskers such as silicon carbide are recognized as a health hazard similar to asbestos when the diameter of the whiskers is below 3μ. Consequently the present invention is of substantial value in producing whiskers which are of uniform diameter larger than about 3μ, and which can, as a result, be more safely handled and processed.

Although the invention has been described with reference to these preferred embodiments, other embodiments can achieve the same results. Variations and modifications of the present invention will be obvious to those skilled in the art and it is intended to cover in the appended claims all such modifications and equivalents.

What is claimed is:

1. In the VLS process for growing crystalline whiskers of silicon carbide or silicon nitride on a growth substrate coated with a VLS catalyst, wherein silicon monoxide and an anionic feed gas selected from the group consisting of gaseous light hydrocarbons and ammonia are reacted under VLS growth conditions in a growth zone of a furnace in which said substrate is positioned, the improvement comprising providing gaseous silicon monoxide for whisker formation by passing a carrier gas stream through a silicon dioxide and carbon mass in a porous silicon monoxide generator located separate from said growth zone, whereby gaseous silicon monoxide is introduced into said growth zone at a controlled concentration and flow rate.

2. In the VLS process for growing crystalline whiskers of boron carbide or boron nitride on a growth substrate coated with a VLS catalyst, wherein boron monoxide and an anionic feed gas selected from the group consisting of gaseous light hydrocarbons and ammonia are reacted under VLS growth conditions in a growth zone of a furnace in which said substrate is positioned, the improvement comprising providing gaseous boron monoxide for whisker formation by passing a carrier gas stream through a boron and boric acid mass in a porous boron monoxide generator located separate from said growth zone, whereby gaseous boron monoxide is introduced into said growth zone at a controlled concentration and flow rate.

3. In an apparatus for growing single crystal whiskers by the VLS process, wherein a gaseous suboxide of silicon or boron is generated in a porous solid-state suboxide generator and reacted with an anionic feed gas selected from the group consisting of gaseous light hydrocarbons and ammonia under VLS growth conditions in a growth zone of a furnace containing a growth substrate coated with a VLS catalyst, the improvement comprising means for passing a controlled flow of a carrier gas through said porous suboxide generator and into said growth zone of said furnace, with said porous suboxide generator being located separate from said growth zone, whereby said gaseous suboxide of silicon or boron is introduced into said growth zone at a controlled flow rate and concentration.

* * * * *